United States Patent [19]

Tihanyi

[11] Patent Number: 4,584,593
[45] Date of Patent: Apr. 22, 1986

[54] INSULATED-GATE FIELD-EFFECT TRANSISTOR (IGFET) WITH CHARGE CARRIER INJECTION

[75] Inventor: Jenö Tihanyi, Munich, Fed. Rep. of Germany

[73] Assignee: Siemens Aktiengesellschaft, Berlin and Munich, Fed. Rep. of Germany

[21] Appl. No.: 510,080

[22] Filed: Jun. 30, 1983

[30] Foreign Application Priority Data

Jul. 1, 1982 [DE] Fed. Rep. of Germany ....... 3224618

[51] Int. Cl.$^4$ .............................................. H01L 29/78
[52] U.S. Cl. .................................... 357/23.4; 357/43; 357/41
[58] Field of Search ...................... 357/23.4, 52, 41, 43

[56] References Cited

U.S. PATENT DOCUMENTS

| | | | |
|---|---|---|---|
| 3,831,187 | 8/1979 | Neilson | 357/23.4 |
| 4,048,649 | 9/1977 | Bohn | 357/41 |
| 4,199,774 | 4/1980 | Plummer | 357/23.4 |
| 4,300,150 | 11/1981 | Colak | 357/52 |
| 4,344,081 | 8/1982 | Pao | 357/23.4 |
| 4,345,265 | 8/1982 | Blanchard | 357/41 |
| 4,364,073 | 12/1982 | Becke et al. | 357/23.4 |
| 4,376,286 | 3/1983 | Lidow | 357/41 |
| 4,402,003 | 8/1983 | Blanchard | 357/43 |
| 4,414,560 | 11/1983 | Lidow | 357/41 |
| 4,441,117 | 4/1984 | Zommer | 357/43 |
| 4,454,527 | 6/1984 | Patalong | 357/23.4 |
| 4,471,372 | 9/1984 | Tihanyi | 357/43 |

FOREIGN PATENT DOCUMENTS

| | | | |
|---|---|---|---|
| 40816 | 5/1981 | European Pat. Off. | 357/23.4 |
| 140262 | 11/1980 | Japan | 357/41 |

OTHER PUBLICATIONS

Tihanyi; International Electron Devices Meeting; CH1616-2/80, pp. 75–78.

Primary Examiner—Andrew J. James
Assistant Examiner—Mark Prenty
Attorney, Agent, or Firm—Herbert L. Lerner; Laurence A. Greenberg

[57] ABSTRACT

An IGFET assembly, includes a semiconductor substrate of a given first conductivity type having first and second surfaces, and an IGFET having at least one channel zone of a second conductivity type opposite the given first conductivity type embedded in the first surface of the substrate, a source zone of the first conductivity type embedded in the channel zone, a drain zone adjacent the first surface of the substrate, a drain electrode connected to the second surface of the substrate, a gate electrode disposed above and insulated from the first surface of the substrate, an injector zone of the second conductivity type being embedded in the first surface of the substrate under the gate electrode and being connectible to a voltage source, the injector zone having a surface and having a doping, at least at the surface of the injector zone, causing an inversion layer to be formed at the surface of the injector zone when the IGFET is switched on, and a contact zone of the second conductivity type embedded in the first surface of the substrate and contacting the injector zone at a common boundary of the contact and injector zones below the gate electrode, the contact zone having a surface and having a higher doping than the injector zone preventing an inversion layer from forming at the surface of the contact zone when the IGFET is switched on.

7 Claims, 3 Drawing Figures

INSULATED-GATE FIELD-EFFECT TRANSISTOR (IGFET) WITH CHARGE CARRIER INJECTION

The invention relates to an insulated-gate field-effect transistor (IGFET) with a semiconductor substrate of a first conduction or conductivity type, at least one channel zone of a second, opposite conduction type, embedded in a first surface of the substrate, a source zone of the first conduction type embedded in the channel zone, a drain zone adjacent the first surface, a drain electrode connected to a second surface, an injector zone of the second, opposite conduction type embedded in the first surface and being connectible to a voltage, and a gate electrode insulated from the first surface.

Such an IGFET is the subject of U.S. application Ser. No. 340,749, filed Jan. 19, 1982 and now abandoned. The injector zone in the latter patent application has the purpose of reducing the forward resistance which is relatively high, particularly in high-voltage power FETs of conventional construction. For this purpose, the injector zone is connected to an external voltage source and injects charge carriers into the drain zone of the IGFET by an accumulation layer which develops under the gate electrode, if the region of the drain zone which is at the surface and is adjacent to the injector zone becomes negative relative to the drain potential. The charge carriers injected into the drain zone cause a quasi increase of the doping in the current path. This equals a reduction of the forward resistance $R_{on}$.

Starting from the above-described device, it is accordingly an object of the instant invention to provide an insulated-gate field-effect transistor (IGFET) with charge carrier injection, which further reduces the forward resistance $R_{on}$.

With the foregoing and other objects in view there is provided, in accordance with the invention, an IGFET assembly, comprising a semiconductor substrate of a given first conductivity type having first and second surfaces, and an IGFET having at least one channel zone of a second conductivity type opposite the given first conductivity type embedded in the first surface of the substrate, a source zone of the first conductivity type embedded in the channel zone, a drain zone adjacent the first surface of the substrate, a drain electrode connected to the second surface of the substrate, a gate electrode disposed above and insulated from the first surface of the substrate, an injector zone of the second conductivity type being embedded in the first surface of the substrate under the gate electrode and being connectible to a voltage source, the injector zone having a doping, at least at the surface of the injector zone, causing an inversion layer to be formed at the surface of the injector zone when the IGFET is switched on, and a contact zone of the second conductivity type embedded in the first surface of the substrate and contacting the injector zone at a common boundary of the contact and injector zones below the gate electrode, the contact zone having a surface and having a higher doping than the injector zone preventing an inversion layer from forming at the surface of the contact zone when the IGFET is switched on.

In accordance with another feature of the invention, there is provided an auxiliary FET embedded in the first surface of the substrate, the auxiliary FET including a channel zone of the second conductivity type electrically connected to the contact zone of the IGFET, a source zone of the first conductivity type, a gate electrode connected to the gate electrode of the IGFET, and a contact electrically connected between the source zone and the channel zone of the auxiliary FET.

In accordance with an additional feature of the invention, there is provided, a jumper or bridge of the second conductivity type embedded in the first surface of the substrate and connected between the channel zone of the auxiliary FET and the contact zone of the IGFET.

In accordance with a further feature of the invention, the gate electrodes of the IGFET and the auxiliary FET are in the form of a common gate electrode, the inversion or accumulation layer is disposed between the channel zones of the IGFET and the auxiliary FET under the common gate electrode, and the contact zone of the IGFET is disposed under the common gate electrode between the IGFET and the auxiliary FET completely interrupting the inversion layer.

In accordance with again another feature of the invention, the channel zones of the IGFET and the auxiliary FET in the substrate have a side facing away from the first surface of the substrate including a region of higher doping and of the second conductivity type and the jumper is connected to the region.

In accordance with still a further feature of the invention, the channel zones of the IGFET and the auxiliary FET in the substrate have a side facing away from the first surface of the substrate including a region of higher doping and of the second conductivity type, and including a jumper connected between the contact zone of the IGFET and the channel zone of the auxiliary FET and connected to the region.

In accordance with a concomitant feature of the invention there is provided at least one additional IGFET, all of the IGFETs being electrically connected to each other in parallel, and at least one additional auxiliary FET, all of the FETs being disposed in raster fashion, and the injector zones and the contact zones of the IGFETs are all of annular shape and each surround a respective auxiliary FET.

Other features which are considered as characteristic for the invention are set forth in the appended claims.

Although the invention is illustrated and described herein as embodied in an insulated-gate field-effect transistor (IGFET) with charge carrier injection, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
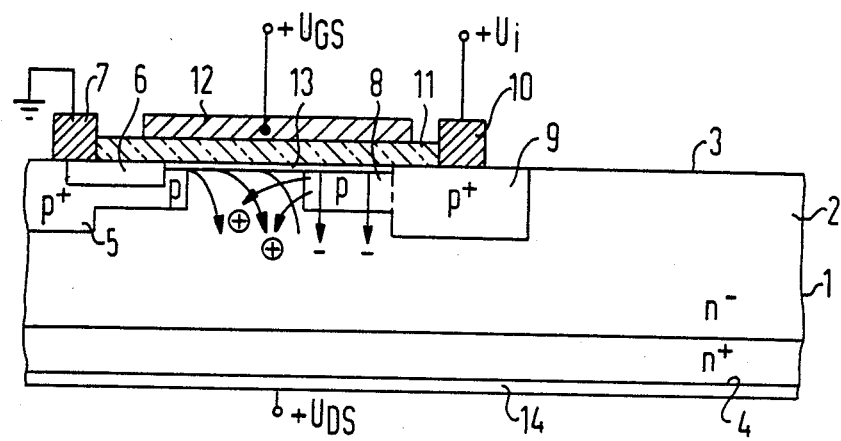
FIG. 1 is a fragmentary, cross-sectional view of a first embodiment of the invention.

Referring now to the figures of the drawing in detail and first particularly to FIG. 1 thereof, there is seen an IGFET constructed on a substrate 1, having a first conduction or conductivity type. The substrate 1 contains a weakly n-doped zone 2 which forms the drain zone of the IGFET. The first surface of the substrate is designated with reference numeral 3 and the second surface is designated with reference numeral 4. A channel zone 5 of a second conduction or conductivity type which is opposite that of the substrate 1, is embedded in the first surface 3 in a planar fashion. A source zone 6 of the first conduction type is likewise embedded planar in the channel zone 5. The source zone 6 is heavily doped as compared to the substrate. An injector zone 8 is embedded planar in the first surface 3 at a lateral distance from the channel zone 5. The injector zone 8 is contacted by a contact zone 9 which is of the same conduction type as the injector zone 8 but is doped more heavily than the latter. The contact zone 9 in turn is contacted by a contact 10.

The surface 3 of the substrate 1 is covered by an insulating layer 11 on which a gate electrode 12 is disposed. The gate electrode 12 covers a part of the channel zone 5 which emerges to the surfaces 3, a part of the drain zone 2 which emerges to the surface 3, and the injector zone 8. The gate electrode 12 is also extended at least beyond the boundary between the injector zone 8 and the contact zone 9. In the embodiment of FIG. 1, the gate electrode 12 slightly overlaps the contact zone 9. The source zone 6 is provided with a contact 7 which simultaneously forms a shunt to the channel zone 5. The second surface 4 of the substrate 1 is provided with an ohmic electrode 14. A highly doped zone of the same conduction type as the drain zone 2, is further located between the electrode 14 and the drain zone 2 to improve the shunt conductivity.

If a voltage $+U_{DS}$ is applied to the IGFET and a voltage $+U_{GS}$ is applied to the gate electrode 12, an accumulation layer 13 formed of negative charge carriers develops under the gate electrode 12 at the surface of the drain zone 2. At the same time, an inversion layer formed of negative charge carriers develops at the surface 3 in vicinity of the channel zone 5, so that negative charge carriers can flow from the source zone 6 through the channel 5 into the drain zone 2.

With increasing voltage $U_{GS}$, the accumulation layer 13 expands in direction toward the injector zone 8. If the accumulation layer 13 reaches the injector zone 8, an inversion layer which is of n-conduction nature, forms at the surface of the injector zone 8, with a further increase of the voltage $+U_{GS}$. With the development of the inversion layer over the injector zone, an npn-zone sequence is therefore formed, i.e. a bipolar transistor. The inversion or accumulation zone 13 forms the emitter, the injector zone 8 forms the base and the drain zone 2 forms the collector, of the bipolar transistor. With increasing gate voltage $+U_{GS}$, a bipolar transistor is therefore added in the substrate, having an emitter bias which is represented by the source voltage minus the voltage drop at the inversion layer 13. The base bias is given by the potential $+U_i$ of the contact zone. The base bias is positive relative to the source potential.

With increasing gate voltage $+U_{GS}$, the bipolar transistor is opened gradually and furthermore injects positive charge carriers into the drain zone 2. The electron current injected by the bipolar transistor is equal to the current flowing from the voltage source $U_i$, times the current gain $\beta$ of the bipolar transistor. The current of positive charge carriers injected into the drain zone is considered to be equal to an increase of the doping in the drain zone, and therefore causes a reduction of the forward resistance $R_{on}$.

In order to ensure that an inversion layer is able to form at the surface of the injector zone 8 at the gate voltages of interest, even if the voltage $U_i$ is small, the injector zone 8 is relatively weakly doped at least at the surface, like the channel zone 5, for instance. On the other hand, the doping of the contact zone 9 must be so high that it is not excited to the point where it will emit positive charge carriers, since only such regions are supposed to inject charge carriers into the drain zone 2 which are adjacent to the current path, i.e. the channel. The injector zone can have a doping at the surface of between $10^{16}$ and $10^{17}$ atoms per $cm^{-3}$, while the contact zone may have a doping at the surface between $10^{18}$ and $10^{20}$. In this way, a good emission effect and therefore a lowering of the forward resistance $R_{on}$ by at least a factor of 3 is achieved with a resistivity of 50 ohms cm for the drain zone 2, a thickness of the insulating layer 11 of, for instance, 60 nm, a gate voltage $U_{GS}$ of, for instance, 10 V and a voltage $U_i$ of, for instance 1 V. The voltage $+U_i$ need not come from a separate voltage source; the electrode 10 may also be connected directly or through a resistor to the gate voltage source.

Figure 2:
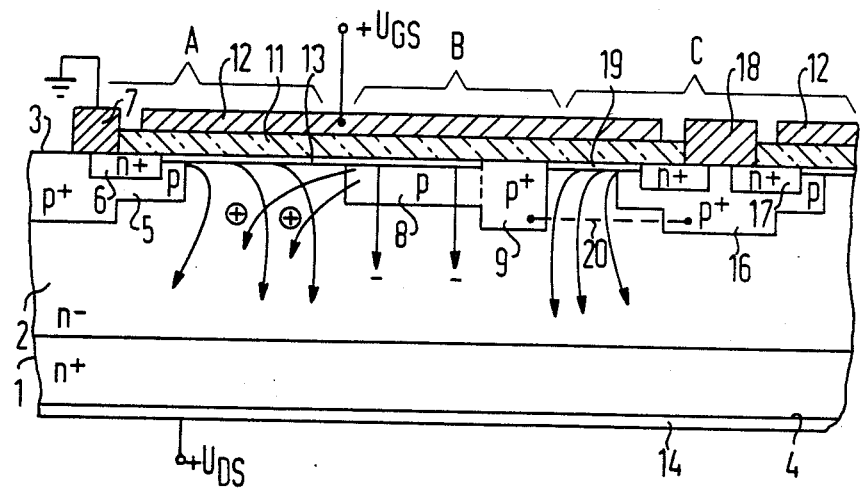
FIG. 2 is a view similar to FIG. 1 of a second embodiment of the invention.

The bipolar transistor requires a certain amount of control power which is undesirable for many purposes. In FIG. 2, a device is shown in which the control power for the bipolar transistor stems from the source-drain voltage source. In FIG. 2, like parts or parts with the same function are provided with the same reference numerals as in FIG. 1. The IGFET according to FIG. 2 differs from that according to FIG. 1 in that an auxiliary FET C is integrated into the surface 3 of the substrate 1. This auxiliary FET has a channel zone 16 and a source zone 17. The two zones 16, 17 are electrically connected to each other through a contact 18. The auxiliary FET is provided with a gate electrode which may preferably be the gate electrode which is used for the control of the FET 6, 5, 2, which is given reference symbol A in FIG. 2. The gate electrode must completely cover the part of the channel zone 16 which emerges to the surface 3.

If a positive gate voltage is applied, the IGFET A formed of the zones 6, 5 and 2, and the auxiliary FET C, begin to conduct, forming accumulation zones 13 and 19. The charge carriers of the auxiliary FET C, starting from the source zone 17, take the course indicated by the arrows toward the drain electrode 14. The potential of the source zone 17 is thus adjusted to a potential which is positive relative to the potential of the source zone 6.

Since the channel zone 16 is electrically connected to the source zone 17 by the contact 18, the channel zone 16 is also biased positively relative to the source zone 6. The channel zone 16 is electrically connected to the contact zone 9 by a connection 20, shown in broken lines. This connection is advantageously established by a jumper disposed in a plane other than that of the drawing. The jumper should have the same conduction type as the channel zone 16 and the contact zone 9. Advantageously, it is also equally highly doped. In this way, the contact zone 9 is positively biased relative to the source zone 6 and the above-described action of the bipolar transistor, which is given reference symbol B in FIG. 2, sets in, provided that the accumulation layer 13 has lead to an inversion of the region of the injector zone 8 near the surface. This is the case, for instance, with the construction mentioned in connection with FIG. 1.

In order to ensure that the source current coming from the auxiliary FET C does not flow off directly through an accumulation layer to the source contact 7, the contact zone 9 of the bipolar transistor B is disposed between the IGFET and the auxiliary FET C in such a manner that the two accumulation layers 13, 19 are formed under the gate electrode 12 and are completely electrically separated from each other. In this case, the auxiliary FET C therefore furnishes the base current for the bipolar transistor B.

Figure 3:
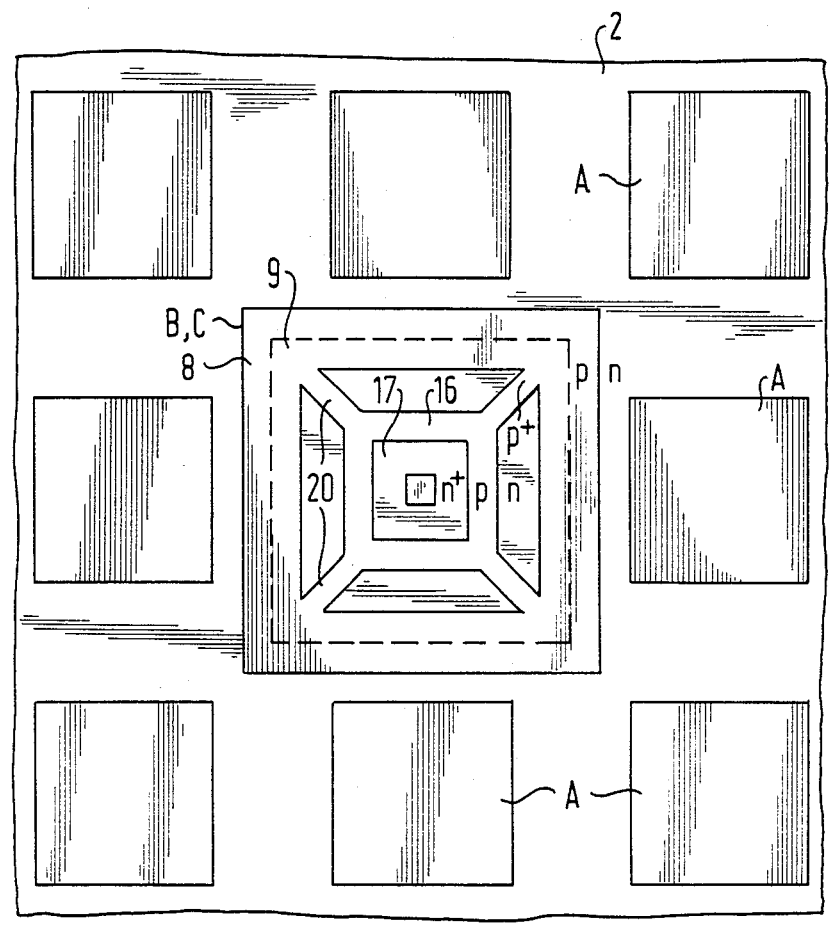
FIG. 3 is a top plan view of a semiconductor device with a multiplicity of IGFETs integrated on a chip according to FIG. 2.

For larger currents, several of the structures A, B and C can be constructed on a chip in raster fashion. In FIG. 3, a top plan view of such a structure is shown, in which, for the sake of better clarity, all electrodes and the insulating layer 11 have been omitted. The IGFETs A are connected in parallel in FIG. 3 by a metal layer. The electrical connections 20 mentioned with reference to FIG. 2 are shown in this case as diagonally extending heavily p-doped jumpers. Another essential feature in this case is the complete interruption of the accumulation layer belonging to the IGFET cells A, from the accumulation layers belonging to the auxiliary FET cells C. For this purpose, the contact zones 9 and the injector zones 8 are of annular shape and surround each auxiliary FET C in the form of a ring.

The foregoing is a description corresponding in substance to German Application No. P 32 24 618.8, dated July 1, 1982, the International Priority of which is being claimed for the instant application, and which is hereby made part of this application. Any material discrepancies between the foregoing specification and the aforementioned corresponding German application are to be resolved in favor of the latter.

I claim:

1. IGFET assembly, comprising a semiconductor substrate of a given first conductivity type having first and second surfaces, and an IGFET having at least one channel zone of a second conductivity type opposite said given first conductivity type embedded in said first surface of said substrate, a source zone of said first conductivity type embedded in said channel zone, a drain zone adjacent said first surface of said substrate, a drain electrode connected to said second surface of said substrate, a gate electrode disposed above and insulated from said first surface of said substrate, an injector zone of said second conductivity type being embedded in said first surface of said substrate under said gate electrode and being connectible to a voltage source, said injector zone having a surface and having a doping, at least at said surface of said injector zone, causing an inversion layer to be formed at said surface of said injector zone when said IGFET is switched on, and a contact zone of said second conductivity type embedded in said first surface of said substrate and contacting said injector zone at a common boundary of said contact and injector zones below said gate electrode, said contact zone having a surface and having a higher doping than said injector zone preventing an inversion layer from forming at said surface of said contact zone when said IGFET is switched on.

2. IGFET assembly according to claim 1, including an auxiliary FET embedded in said first surface of said substrate, said auxiliary FET including a channel zone of said second conductivity type electrically connected to said contact zone of said IGFET, a source zone of said first conductivity type, a gate electrode electrically connected to said gate electrode of said IGFET, and a contact electrically connected between said source zone and said channel zone of said auxiliary FET.

3. IGFET assembly according to claim 2, including a jumper of said second conductivity type embedded in said first surface of said substrate and connected between said channel zone of said auxiliary FET and said contact zone of said IGFET.

4. IGFET assembly according to claim 2, wherein said gate electrodes of said IGFET and said auxiliary FET are in the form of a common gate electrode, said inversion layer is disposed between said channel zones of said IGFET and said auxiliary FET under said common gate electrode, and said contact zone of said IGFET is disposed under said common gate electrode between said IGFET and said auxiliary FET completely interrupting said inversion layer.

5. IGFET assembly according to claim 3, wherein said channel zones of said IGFET and said auxiliary FET in said substrate have a side facing away from said first surface of said substrate including a region of higher doping and of said second conductivity type, and said jumper is connected to said region.

6. IGFET assembly according to claim 4, wherein said channel zones of said IGFET and said auxiliary FET in said substrate have a side facing away from said first surface of said substrate including a region of higher doping and of said second conductivity type, and including a jumper connected between said contact zone of said IGFET and said channel zone of said auxiliary FET and connected to said region.

7. IGFET assembly according to claim 2, at least two additional IGFETs, said IGFETs being electrically connected to each other in parallel, and at least two additional auxiliary FETs, said FETs being disposed in the first surface of the substrate in planar fashion, and wherein said injector zones and said contact zones of said IGFETs are of annular shape and wherein each surrounds a respective auxiliary FET.

* * * * *